(12) United States Patent
Yu

(10) Patent No.: US 7,969,656 B2
(45) Date of Patent: Jun. 28, 2011

(54) WAFER LEVEL LENS MODULE ARRAY WITH SPACER ARRAY

(75) Inventor: Tai-Cherng Yu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/576,333

(22) Filed: Oct. 9, 2009

(65) Prior Publication Data
US 2010/0246000 A1    Sep. 30, 2010

(30) Foreign Application Priority Data
Mar. 30, 2009   (CN) .......................... 2009 1 0301190

(51) Int. Cl.
*G02B 27/10*   (2006.01)
(52) U.S. Cl. ....................................................... 359/622
(58) Field of Classification Search .................. 359/622
See application file for complete search history.

(56) References Cited

U.S. PATENT DOCUMENTS
2010/0177401 A1*   7/2010   Shiraishi ....................... 359/622
* cited by examiner

*Primary Examiner* — William C Choi
(74) *Attorney, Agent, or Firm* — Raymond J. Chew

(57) ABSTRACT

An exemplary wafer level lens module array includes a first lens array, a second lens array above the first lens array, and a spacer array between the first and second lens arrays. The first lens array includes a number of first lenses, and two first aligning structures. The second lens array includes a number of second lenses, and two second aligning structures. The spacer array includes a number of through holes, and two third aligning structures. The first aligning structures respectively align with the third aligning structures, thereby the first lenses are coaxial with the respective the through holes. The second aligning structures respectively align with the third aligning structures, thereby the second lenses are coaxial with the respective through holes.

20 Claims, 5 Drawing Sheets

WAFER LEVEL LENS MODULE ARRAY WITH SPACER ARRAY

BACKGROUND

1. Technical Field

The present disclosure relates to imaging technology, and particularly to wafer level lens module arrays.

2. Description of Related Art

With the ongoing development of optical imaging technology, wafer level lens modules are widely used in electronic devices such as digital cameras, mobile phones, and so on.

Generally, a wafer level lens module includes wafer level optical members, such as lenses, filters, etc, and a wafer level image sensor. In manufacturing, a first wafer including many first wafer level optical members arranged in an array, a second wafer including many second wafer level optical members arranged in an array, and a third wafer including many wafer level image sensors arranged in an array are fabricated. In an assembly process, the first wafer is coupled to the second wafer, and then coupled to the third wafer to form a wafer level lens module array. Finally, the wafer level lens module array is cut into many individual wafer level lens modules.

It is common that the first wafer level optical members are not coaxial with the second wafer level optical members, respectively; such that so-called eccentricities occur. The eccentricities lower the quality of the affected wafer level lens modules.

Therefore, what is needed is a wafer level lens module array which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
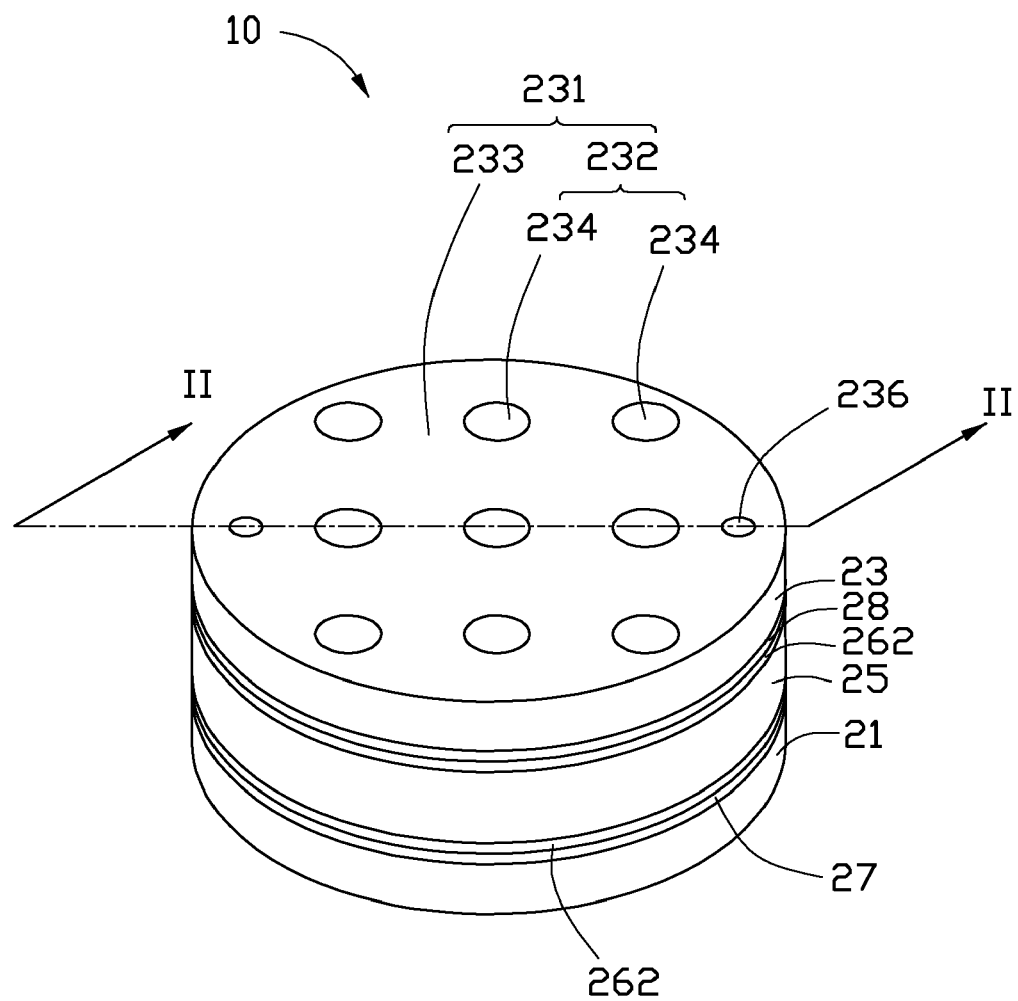
FIG. 1 is an isometric view of a wafer level lens module array according to a first embodiment, the wafer level lens module array including a spacer array.
Figure 2:
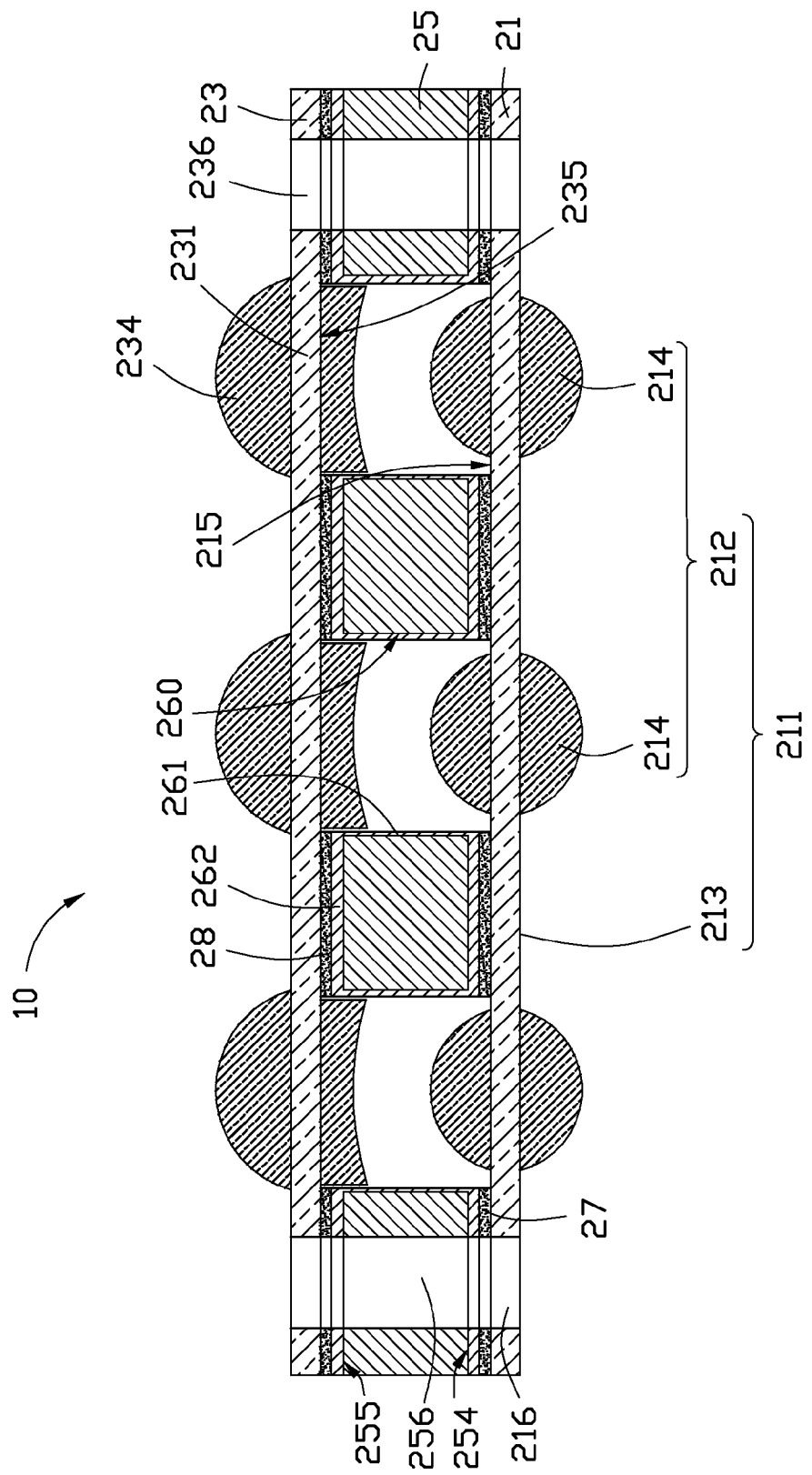
FIG. 2 is a cross sectional view of the wafer level lens module array of FIG. 1, taken along a line II-II thereof.

Referring to FIGS. 1-2, a wafer level lens module array 10, in accordance with a first embodiment, is shown. The wafer level lens module array 10 includes a first lens array 21, a second lens array 23 above the first lens array 21, and a spacer array 25 positioned between the first and second lens arrays 21, 23.

The first lens array 21 includes a first substrate 211. The first substrate 211 includes a first lens section 212, and a first interconnecting section 213. The first lens section 212 includes a plurality of first lenses 214 spaced apart from each other. The first interconnecting section 213 surrounds the first lenses 214, and includes a first surface 215 and at least one first aligning structure 216 formed at the first surface 215. In the present embodiment, there are two first aligning structures 216. Each first aligning structure 216 comprises a round through hole. In alternative embodiments, each first aligning structure 216 may instead comprise a triangular through hole, an E-shaped through hole, a protrusion, etc. In other alternative embodiments, the number of first aligning structures 216 may instead be three, four, etc.

The second lens array 23 is positioned above the first lens array 21, and includes a second substrate 231. The second substrate 231 includes a second lens section 232, and a second interconnecting section 233. The second lens section 232 includes a plurality of second lenses 234 spaced apart from each other. The second interconnecting section 233 surrounds the second lenses 234, and includes a second surface 235 facing toward the first surface 213 and at least one second aligning structure 236 formed at the second surface 235. In the present embodiment, there are two second aligning structures 236. Each second aligning structure 236 comprises a round through hole. In alternative embodiments, each second aligning structure 236 may instead comprise a triangular through hole, an E-shaped through hole, a protrusion, etc. In other alternative embodiments, the number of second aligning structure 236 may instead be one, three, four, etc.

Figure 3:
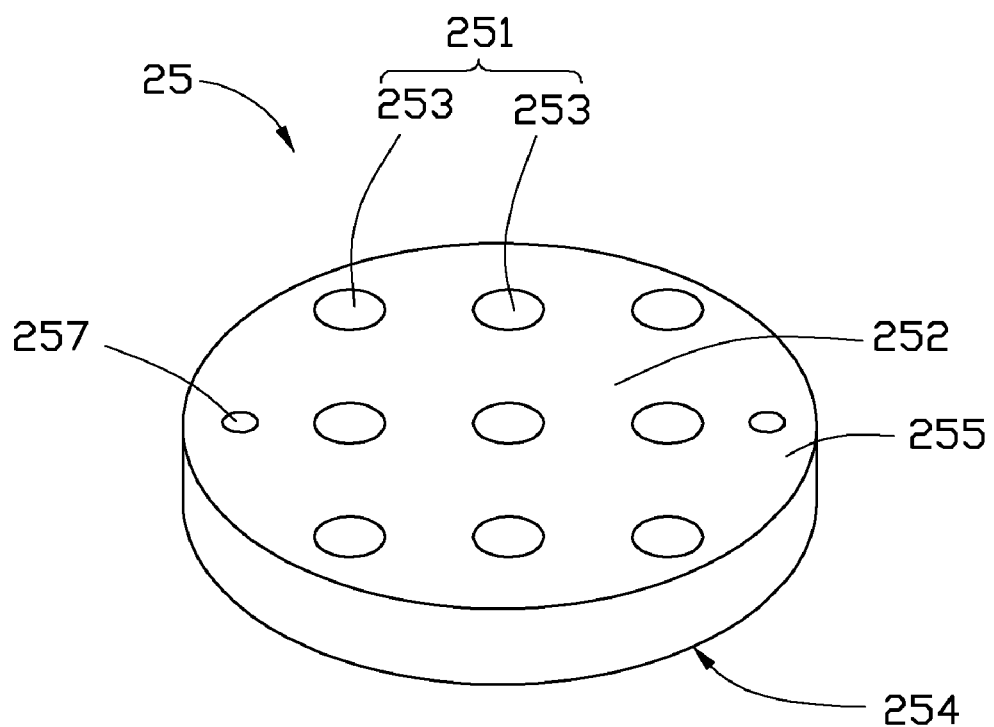
FIG. 3 is an isometric view of the spacer array of the wafer level lens module array of FIG. 1.

The spacer array 25 is positioned between the first and second lens arrays 21, 23. Referring also to FIG. 3, the spacer array 25 is substantially a flat plate, and includes a through hole section 251 and an interconnecting section 252. The through hole section 251 includes a plurality of through holes 253 spaced apart from each other. The through holes 253 allow light to pass therethrough. The interconnecting section 252 surrounds the through holes 253. The interconnecting section 252 includes a third surface 254 generally adjacent to or abutting against the first surface 215, and a fourth surface 255 generally adjacent to or abutting against the second surface 235. In the present embodiment, the third surface 254 is adhered to the first surface 215 by a glue (adhesive) layer 27, and the fourth surface 255 is adhered to the second surface 235 by a glue layer 28.

The interconnecting section 252 has at least one third aligning structure 256 formed thereat. In the present embodiment, there are two third aligning structures 256. Each third aligning structure 256 comprises a round through hole. In alternative embodiments, each third aligning structure 256 may instead comprise a triangular through hole, an E-shaped through hole, etc. In other alternative embodiments, the number of third aligning structure 256 may instead be one, three, four, etc. The first aligning structures 216 align with the respective third aligning structures 256, thereby the first lenses 214 are coaxial with the respective through holes 253. The second aligning structures 236 align with the respective third aligning structures 256, thereby the through holes 253 are coaxial with the respective second lenses 234. As a result, eccentricities are eliminated or at least minimized.

In one example of an alternative embodiment, the first lens array 21 may have one first aligning structure 216 in the center thereof, the second lens array 23 may have one second aligning structure 236 in the center thereof, the third surface 254 may have one third aligning structure 256 in the center thereof, and the fourth surface 255 may have one fourth aligning structure 257 in the center thereof. As such, the first lenses 214 can be coaxial with the respective through holes 253, and the through holes 253 can be coaxial with the respective second lenses 235, such that eccentricities are eliminated or at least minimized.

The spacer array 25 also includes a plurality of cylindrical (or annular) inner surfaces 260 surrounding the respective through holes 253. The inner surfaces 260 have chromium layers 261 formed thereon, respectively. The third and fourth surfaces 254, 255 also have a chromium layer 262 formed thereon, respectively. The chromium layers 261, 262 are configured for absorbing light reflected by the first and second lenses 215, 216 to prevent the light reaching an associated image sensor (not shown). Thereby, glare in use of wafer level lens modules obtained from the wafer level lens module array 10 (see below) can be avoided or at least minimized.

Figure 4:
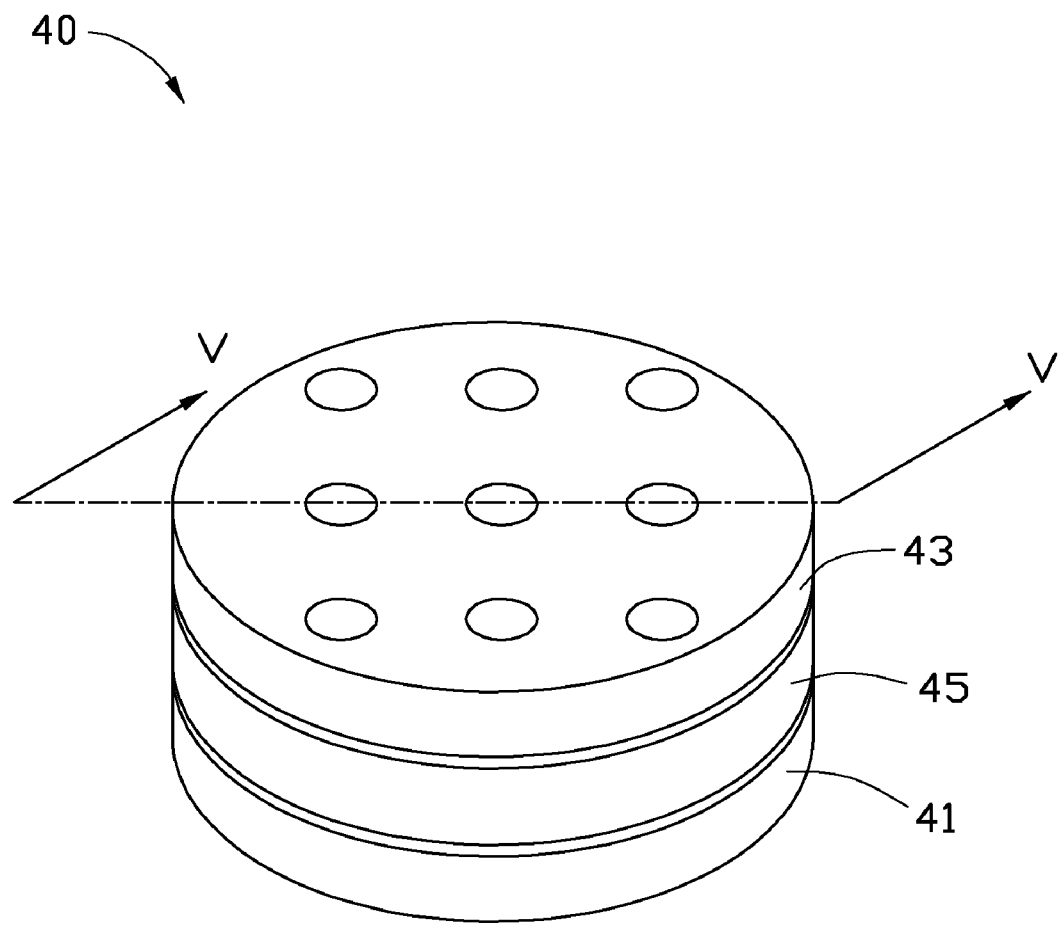
FIG. 4 is an isometric view of a wafer level lens module array according to a second embodiment.
Figure 5:
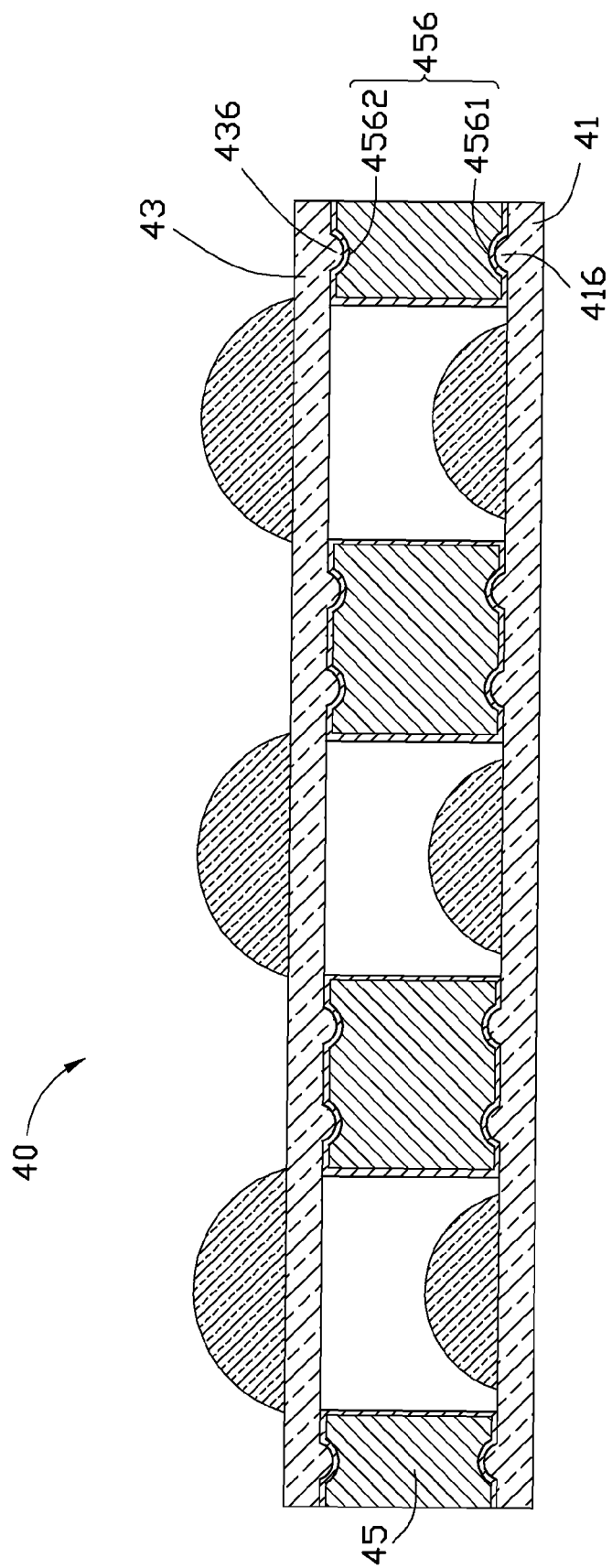
FIG. 5 is a cross sectional view of the wafer level lens module array of FIG. 4, taken along a line V-V thereof.

Referring to FIGS. 4-5, a wafer level lens module array 40, in accordance with a second embodiment, is shown. The wafer level lens module array 40 includes a first lens array 41, a second lens array 43 above the first lens array 41, and a spacer array 45 positioned between the first and second lens arrays 41, 42. The first lens array 41 includes a plurality of first aligning structures 416. The second lens array 42 includes a plurality of second aligning structures 436. The spacer array 45 includes a plurality of third aligning structures 456. The first and second aligning structures 416, 436 are protrusions. Each third aligning structure 456 is two-sided. A bottom side of the third aligning structure 456 is generally adjacent to or abuts against the first lens array 41, and has a recess 4561 defined thereat. In particular, the protrusion of the corresponding first aligning structure 416 is at least partially received in the recess 4561. The other top side of the third aligning structure 456 is generally adjacent to or abuts against the second lens array 43, and has a recess 4562 defined thereat. In particular, the protrusion of the corresponding second aligning structure 436 is at least partially received in the recess 4562.

In an alternative embodiment, the first and second aligning structures 416, 436 may instead be recesses. In such case, one side of each third aligning structure 456 has a protrusion formed thereon, and the other side of each third aligning structure 456 also has a protrusion formed thereon. In another alternative embodiment, the first aligning structures 416 may be recesses, and the second aligning structures 436 may be protrusions. In such case, one side of each third aligning structure 456 has a protrusion formed thereon, and the other side of each third aligning structure 456 has a recess formed thereat.

While certain embodiments have been described and exemplified above, various other embodiments will be apparent to those skilled in the art from the foregoing disclosure. The disclosure is not limited to the particular embodiments described and exemplified but is capable of considerable variation and modification without departure from the scope and spirit of the appended claims.

What is claimed is:

1. A wafer level lens module array comprising:
    a first lens array, the first lens array comprising a plurality of first lenses spaced apart from each other, and a first interconnecting section surrounding the first lenses, the first interconnecting section comprising a first surface, and at least one first aligning structure formed at the first surface;
    a second lens array arranged above the first lens array, the second lens array comprising a plurality of second lenses spaced apart from each other, and a second interconnecting section surrounding the second lenses, the second interconnecting section comprising a second surface facing toward the first surface, and at least one second aligning structure formed at the second surface; and
    a spacer array positioned between the first and second lens arrays, the spacer array comprising a plurality of through holes spaced apart from each other, an interconnecting section surrounding the through holes, a plurality of inner surfaces surrounding the respective through holes, and a chromium layer formed on each of the inner surfaces, the through holes allowing light to pass therethrough, the interconnecting section comprising at least one third aligning structure formed thereat, wherein the at least one first aligning structure is aligned with the at least one third aligning structure such that the first lenses are coaxial with the through holes, respectively, and the at least one second aligning structure is aligned with the at least one third aligning structure such that the second lenses are coaxial with the through holes, respectively.

2. The wafer level lens module array of claim 1, wherein the at least one first aligning structure comprises an item selected from the group consisting of a through hole and a protrusion, the at least one second aligning structure comprises an item selected from the group consisting of a through hole and a protrusion, and the at least one third aligning structure comprises at least one through hole.

3. The wafer level lens module array of claim 1, wherein the at least one first aligning structure is a protrusion, the at least one second aligning structure is a protrusion, and the at least one third aligning structure is two-sided, and one side of the at least one third aligning structure has a recess defined thereat, with the protrusion of the at least one first aligning structure at least partially received in the recess, and the other side of the at least one third aligning structure has a recess defined thereat, with the protrusion of the at least one second aligning structure at least partially received in the recess.

4. The wafer level lens module array of claim 1, wherein the at least one first aligning structure comprises a recess, the at least one second aligning structure comprises a recess, and the at least one third aligning structure is two-sided, and one side of the at least one third aligning structure has a protrusion formed thereon, with the protrusion at least partially received in the recess of the at least one first aligning structure, and the other side of the at least one third aligning structure has a protrusion formed thereon, with the protrusion at least partially received in the recess of the at least one second aligning structure.

5. The wafer level lens module array of claim 1, wherein the at least one first aligning structure comprises a recess, the at least one second aligning structure comprises a protrusion, and the at least one third aligning structure is two-sided, and one side of the at least one third aligning structure has a protrusion formed thereon, with the protrusion at least partially received in the recess of the at least one first aligning structure, and the other side of the at least one third aligning structure has a recess defined thereat, with the protrusion of the at least one second aligning structure at least partially received in the recess.

6. The wafer level lens module array of claim 1, wherein the spacer array further comprises a third surface abutting the first lens array, a fourth surface abutting the second lens array, and a chromium layer formed on each of the third and fourth surfaces.

7. The wafer level lens module array of claim 6, wherein the first lens array comprises a first aligning structure in the center thereof, the second lens array comprises a second aligning structure in the center thereof, the third surface comprises a third aligning structure in the center thereof, and the fourth surface comprises a fourth aligning structure in the center thereof.

8. The wafer level lens module array of claim 6, wherein the third surface is adhered to the first surface by a glue layer, and the fourth surface is adhered to the second surface by a glue layer.

9. A wafer level lens module array comprising:
a first lens array, the first lens array comprising a plurality of first lenses spaced apart from each other, and a plurality of first aligning structures at a periphery of the plurality of first lenses;
a second lens array arranged above the first lens array, the second lens array comprising a plurality of second lenses spaced apart from each other, and a plurality of second aligning structures at a periphery of the plurality of second lenses; and
a spacer array positioned between the first and second lens arrays, the spacer array comprising a plurality of through holes spaced apart from each other, an interconnecting section surrounding the through holes, a plurality of inner surfaces surrounding the respective through holes, and a chromium layer formed on each of the inner surfaces, the interconnecting section comprising a plurality of third aligning structures formed thereat, wherein the first aligning structures are aligned with the respective third aligning structures, thereby the first lenses are coaxial with the respective through holes, and the second aligning structures are aligned with the respective third aligning structures, thereby the second lenses are coaxial with the respective through holes.

10. The wafer level lens module array of claim 9, wherein each of the first aligning structures comprises an item selected from the group consisting of a through hole and a protrusion, each of the second aligning structures comprises an item selected from the group consisting of a through hole and a protrusion, and each of the third aligning structures comprises a through hole.

11. The wafer level lens module array of claim 9, wherein each of the first aligning structures is a protrusion, each of the second aligning structures is a protrusion, and each of the third aligning structures is two-sided, and one side of each of the third aligning structures has a recess defined thereat, with the protrusion of the corresponding first aligning structure at least partially received in the recess, and the other side of each of the third aligning structures has a recess defined thereat, with the protrusion of the corresponding second aligning structure at least partially received in the recess.

12. The wafer level lens module array of claim 9, wherein each of the first aligning structures comprises a recess, each of the second aligning structures comprises a recess, and each of the third aligning structures is two-sided, and one side of each of the third aligning structures has a protrusion formed thereon, with the protrusion at least partially received in the recess of the corresponding first aligning structure, and the other side of each of the third aligning structures has a protrusion formed thereon, with the protrusion at least partially received in the recess of the corresponding second aligning structure.

13. The wafer level lens module array of claim 9, wherein each of the first aligning structures comprises a recess, each of the second aligning structures comprises a protrusion, and each of the third aligning structures is two-sided, and one side of each of the third aligning structures has a protrusion formed thereon, with the protrusion at least partially received in the recess of the corresponding first aligning structure, and the other side of each of the third aligning structures has a recess defined thereat, with the protrusion of the corresponding second aligning structure at least partially received in the recess.

14. The wafer level lens module array of claim 9, wherein the spacer array further comprises a third surface abutting the first lens array, a fourth surface abutting the second lens array, and a chromium layer formed on each of the third and fourth surfaces.

15. The wafer level lens module array of claim 14, wherein the first lens array comprises a first aligning structure in the center thereof, the second lens array comprises a second aligning structure in the center thereof, the third surface comprises a third aligning structure in the center thereof, and the fourth surface comprises a fourth aligning structure in the center thereof.

16. The wafer level lens module array of claim 14, wherein the third surface is adhered to the first surface by a glue layer, and the fourth surface is adhered to the second surface by a glue layer.

17. A wafer level lens module array comprising:
a first lens array, the first lens array comprising a plurality of first lenses spaced apart from each other, and a first interconnecting section surrounding the first lenses, the first interconnecting section comprising a first surface, and at least one first aligning structure formed at the first surface;
a second lens array arranged above the first lens array, the second lens array comprising a plurality of second lenses spaced apart from each other, and a second interconnecting section surrounding the second lenses, the second interconnecting section comprising a second surface facing toward the first surface, and at least one second aligning structure formed at the second surface; and
a spacer array positioned between the first and second lens arrays, the spacer array comprising a plurality of through holes spaced apart from each other, an interconnecting section surrounding the through holes, a third surface abutting the first lens array, a fourth surface abutting the second lens array, and a chromium layer formed on each of the third and fourth surfaces, the through holes allowing light to pass therethrough, and the interconnecting section comprising at least one third aligning structure formed thereat, wherein the at least one first aligning structure is aligned with the at least one third aligning structure such that the first lenses are coaxial with the through holes, respectively, and the at least one second aligning structure is aligned with the at least one third aligning structure such that the second lenses are coaxial with the through holes, respectively.

18. The wafer level lens module array of claim 17, wherein the at least one first aligning structure comprises an item selected from the group consisting of a through hole and a protrusion, the at least one second aligning structure comprises an item selected from the group consisting of a through hole and a protrusion, and the at least one third aligning structure comprises at least one through hole.

19. The wafer level lens module array of claim 17, wherein the at least one first aligning structure is a protrusion, the at least one second aligning structure is a protrusion, and the at least one third aligning structure is two-sided, and one side of the at least one third aligning structure has a recess defined thereat, with the protrusion of the at least one first aligning structure at least partially received in the recess, and the other side of the at least one third aligning structure has a recess defined thereat, with the protrusion of the at least one second aligning structure at least partially received in the recess.

20. The wafer level lens module array of claim 17, wherein the at least one first aligning structure comprises a recess, the at least one second aligning structure comprises a recess, and the at least one third aligning structure is two-sided, and one side of the at least one third aligning structure has a protrusion formed thereon, with the protrusion at least partially received in the recess of the at least one first aligning structure, and the other side of the at least one third aligning structure has a protrusion formed thereon, with the protrusion at least partially received in the recess of the at least one second aligning structure.

* * * * *